(12) United States Patent
Wang et al.

(10) Patent No.: US 12,287,364 B2
(45) Date of Patent: Apr. 29, 2025

(54) TEST SYSTEM AND TEST DEVICE

(71) Applicant: Leadpower-semi CO., LTD., Zhubei (TW)

(72) Inventors: Cheng-Jyun Wang, Taoyuan (TW); Po-Hsien Li, Taipei (TW); Jen-Hao Yeh, Hsinchu County (TW)

(73) Assignee: LEADPOWER-SEMI CO., LTD., Zhubei (TW)

( * ) Notice: Subject to any disclaimer, the term of this patent is extended or adjusted under 35 U.S.C. 154(b) by 195 days.

(21) Appl. No.: 18/344,249

(22) Filed: Jun. 29, 2023

(65) Prior Publication Data
US 2024/0302427 A1  Sep. 12, 2024

(30) Foreign Application Priority Data

Mar. 10, 2023  (TW) .................................. 112108978

(51) Int. Cl.
*G01R 31/26* (2020.01)
*G01R 1/073* (2006.01)

(52) U.S. Cl.
CPC ..... *G01R 31/2601* (2013.01); *G01R 1/07307* (2013.01)

(58) Field of Classification Search
CPC .... G01R 1/073; G01R 1/07307; G01R 1/067; G01R 31/26; G01R 31/2601; G01R 31/2607; G01R 31/2608; G01R 31/2621; G01R 31/2886
See application file for complete search history.

(56) References Cited

FOREIGN PATENT DOCUMENTS

CN  118777819 A  * 10/2024 ......... G01R 31/2621

* cited by examiner

*Primary Examiner* — Lee E Rodak
*Assistant Examiner* — Jeremiah J Barron
(74) *Attorney, Agent, or Firm* — MUNCY, GEISSLER, OLDS & LOWE, P.C.

(57) ABSTRACT

A test system includes a to-be-tested die including a to-be-tested transistor and a sense transistor, and a test device including a signal amplifying unit, a testing unit, and a probe card connecting the signal amplifying unit and the testing unit to the die. The signal amplifying unit has a first terminal connected to the to-be-tested transistor, and second and third terminals connected to the sense transistor. The signal amplifying unit stabilizes voltages at the second and third terminals based on a voltage at the first terminal, and generates an amplification voltage based on the voltages at the first to third terminals. The testing unit provides test signals to the to-be-tested transistor, determines magnitudes of currents flowing through the to-be-tested transistor and the sense transistor based on the test signals, the amplification voltage and a predetermined resistance, and thus acquires a current ratio to determine whether the die is defective.

11 Claims, 4 Drawing Sheets

TEST SYSTEM AND TEST DEVICE

CROSS-REFERENCE TO RELATED APPLICATION

This application claims priority to Taiwanese Invention Patent Application No. 112108978, filed on Mar. 10, 2023.

FIELD

The disclosure relates to a test system and a test device, and more particularly to a test system and a test device for chip probing.

BACKGROUND

In conventional semiconductor manufacturing processes, integrated circuits are formed into multiple dies on a semiconductor wafer. After the manufacturing process is complete, the semiconductor wafer is cut into individual dies. Each die is then packaged into a module or combined into a larger system.

Inherent flaws in the wafer, or defects in one or more steps of the manufacturing process may cause some of the dies to be defective (e.g., not meeting preset electrical specifications), and the defective dies may not function as intended after packaging. Therefore, in order to screen out and discard defective dies before packaging, a wafer testing facility may use a test device to perform chip probing (CP) on each die of a to-be-tested wafer prior to packaging. The test device performs the chip probing to detect an on-resistance $R_{DS1(ON)}$ of a power transistor to be tested and an on-resistance $R_{DS2(ON)}$ of a sense power transistor for each die in the to-be-tested wafer, and obtains a current ratio (CR) of the power transistor to the sense power transistor, which is equal to $R_{DS2(ON)}/R_{DS1(ON)}$, and determines whether the current ratio meets a preset current ratio, which serves as the preset electrical specifications, in order to screen out defective dies (i.e., dies with a current ratio that does not meet the preset current ratio).

However, there are two potential problems that may adversely affect the accuracy of the current ratio and thus the testing result. The first problem is that, in order to reduce power loss of the wafer, the wafer may be thinned at the end of the wafer fabrication process, which is called backside grinding and backside metallization (BGBM). The BGBM process may result in wafer warpage, causing the wafer to fail to fit completely on a test chuck of the test device that holds the wafer and provides a test signal to the wafer, so connection between the test chuck and drain terminals of the power transistor to be tested and the sense power transistor of each die may be affected, resulting in an increase in the connection resistance. The second problem is that a contact resistance between a probe unit of the test device and a contact pad of each die may be affected by the number of probes connected to the contact pad and a pressure of the force of the probe unit pressing against the contact pad, resulting in variations in the contact resistance. The above-mentioned two problems may lead to measurement errors in the on-resistances $R_{DS2(ON)}$ and $R_{DS1(ON)}$, resulting in inaccuracy of the current ratio.

SUMMARY

Therefore, an object of the disclosure is to provide a test system that can improve accuracy in chip probing in comparison to the prior art.

According to the disclosure, the test system includes a to-be-tested die and a test device. The to-be-tested die includes a to-be-tested transistor and a sense transistor, each of which includes a first terminal disposed to receive a first test signal, a second terminal, and a control terminal disposed to receive a control signal. The second terminal of the to-be-tested transistor is disposed to receive a second test signal. The test device includes a probe card, a signal amplifying unit and a testing unit. The probe card is electrically connected to the to-be-tested die. The signal amplifying unit includes a first input terminal, a second input terminal and a third input terminal that are electrically connected to the probe card. The first input terminal is electrically connected to the second terminal of the to-be-tested transistor through the probe card. The second input terminal and the third input terminal are electrically connected to the second terminal of the sense transistor through the probe card. The signal amplifying unit is configured to stabilize voltages at the second input terminal and the third input terminal based on a voltage at the first input terminal, and to generate an amplification voltage based on the voltages at the first input terminal, the second input terminal and the third input terminal. The testing unit is electrically connected to the signal amplifying unit for receiving the amplification voltage therefrom, is electrically connected to the probe card, and is configured to generate and output the first test signal to the first terminal of the to-be-tested transistor through the probe card, to generate and output the second test signal to the second terminal of the to-be-tested transistor through the probe card, and to generate and output the control signal to the control terminal of the to-be-tested transistor through the probe card. The testing unit is further configured to determine a first current magnitude of a current flowing through the to-be-tested transistor based on the first test signal and the second test signal, to acquire a second current magnitude of a current flowing through the sense transistor based on the amplification voltage and a predetermined resistance, and to acquire, based on the first current magnitude and the second current magnitude, a current ratio that is used to determine whether the to-be-tested die is defective.

Another object of the disclosure is to provide a test device that can improve accuracy in chip probing in comparison to the prior art.

According to the disclosure, the test device is adapted for testing a to-be-tested die on a wafer. The to-be-tested die includes a to-be-tested transistor and a sense transistor, each of which includes a first terminal, a second terminal and a control terminal. The first terminal and the control terminal of the to-be-tested transistor are electrically connected to the first terminal and the control terminal of the sense transistor, respectively. The test device includes a probe card, a signal amplifying unit and a testing unit. The probe card is to be electrically connected to the to-be-tested die. The signal amplifying unit includes a first input terminal, a second input terminal and a third input terminal that are electrically connected to the probe card. The first input terminal is to be electrically connected to the second terminal of the to-be-tested transistor through the probe card. The second input terminal and the third input terminal are to be electrically connected to the second terminal of the sense transistor through the probe card. The signal amplifying unit is configured to stabilize voltages at the second input terminal and the third input terminal based on a voltage at the first input terminal, and to generate an amplification voltage based on the voltages at the first input terminal, the second input terminal and the third input terminal. The testing unit is electrically connected to the signal amplifying unit for receiving the amplification voltage therefrom, is electrically connected to the probe card, and is configured to generate and output a first test signal, a second test signal and a control signal to the probe card, so as to provide the first test signal, the second test signal and the control signal respectively to the first terminal, the second terminal and the control terminal of the to-be-tested transistor through the probe card. The testing unit is further configured to determine a first current magnitude of a current flowing through the to-be-tested transistor based on the first test signal and the second test signal, to acquire a second current magnitude of a current flowing through the sense transistor based on the amplification voltage and a predetermined resistance, and to acquire, based on the first current magnitude and the second current magnitude, a current ratio that is used to determine whether the to-be-tested die is defective.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
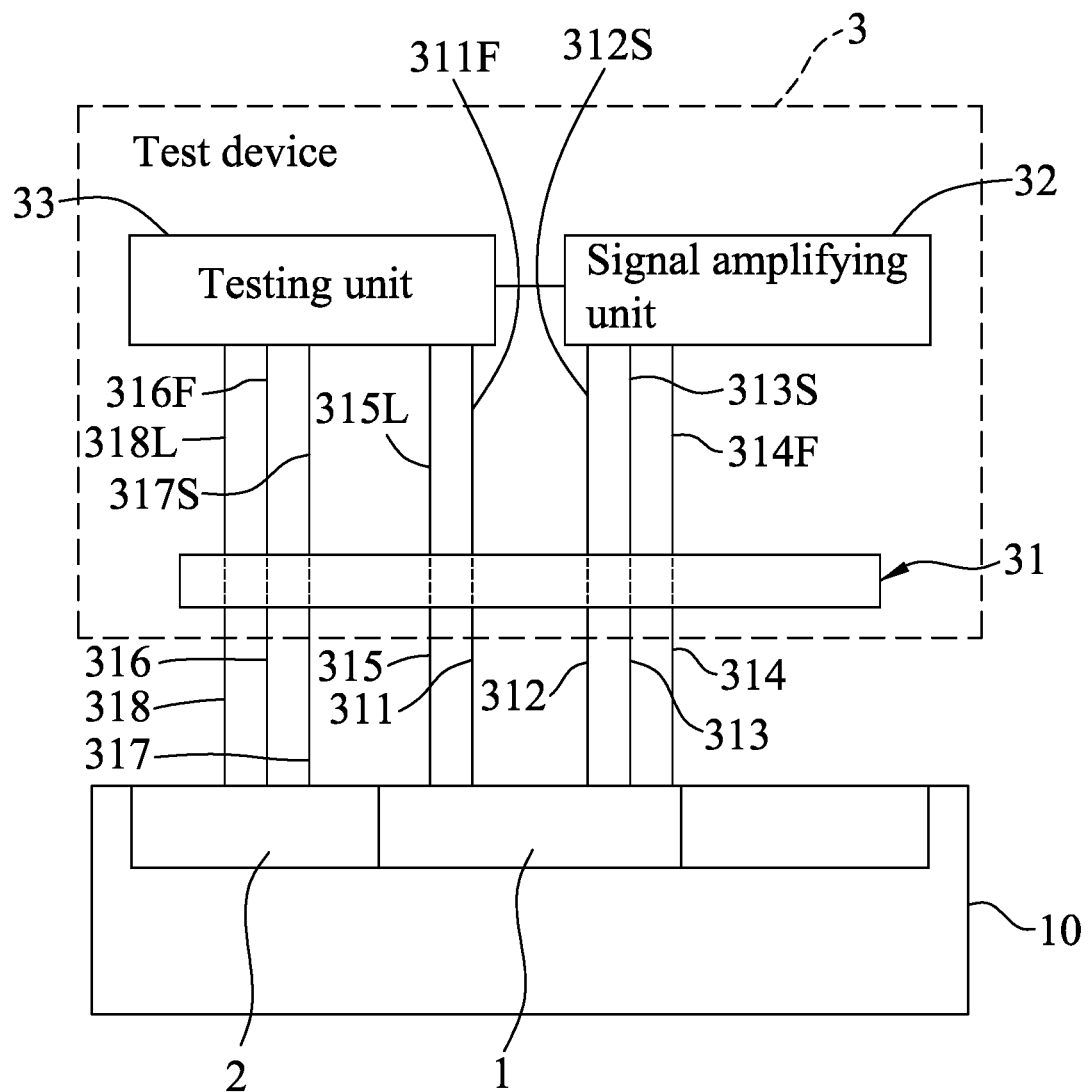
FIG. 1 is a schematic diagram illustrating an embodiment of a test system according to this disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
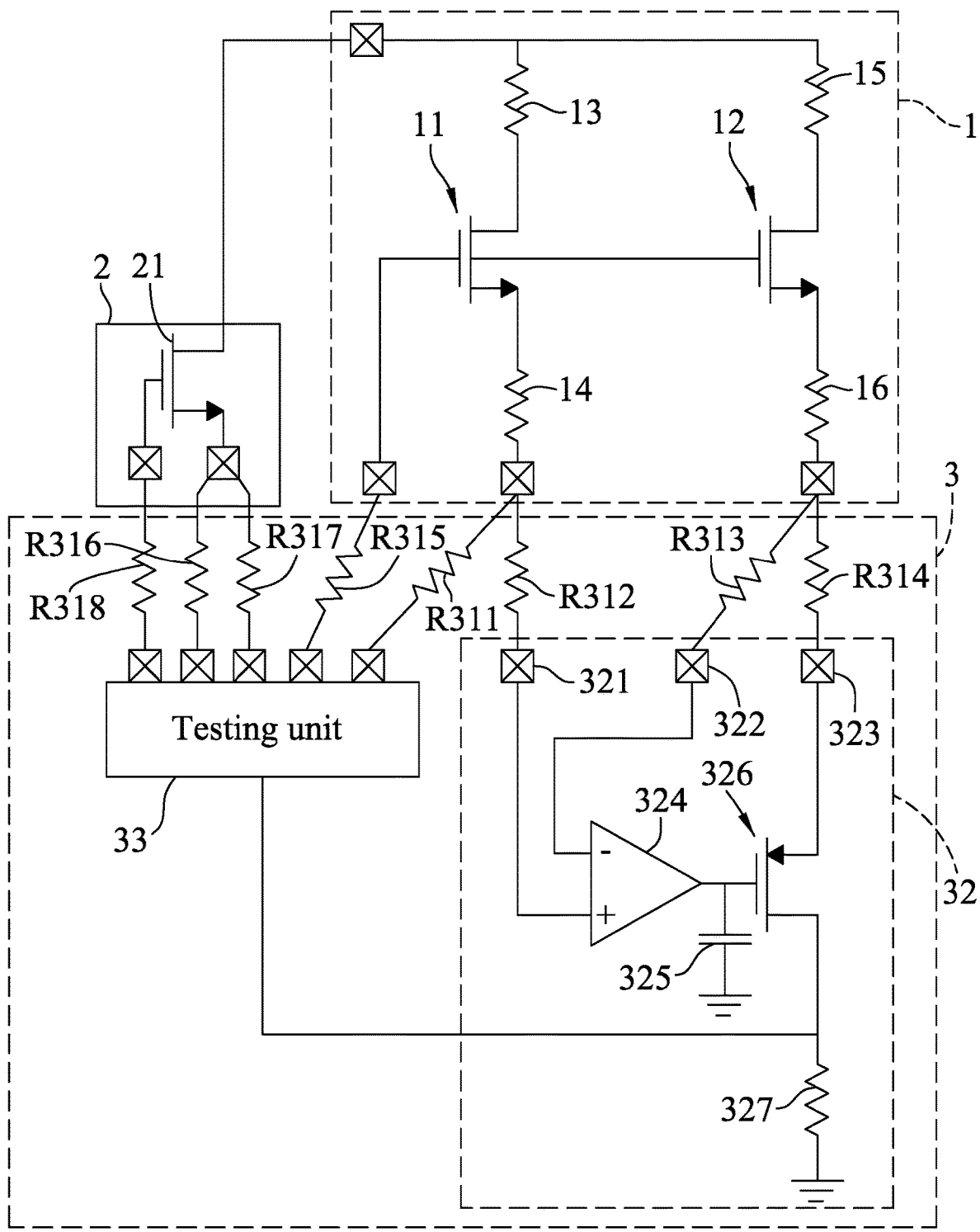
FIG. 2 is schematic circuit diagram illustrating an equivalent circuit of a to-be-tested die, multiple probes and wires, and a signal amplifying unit of the embodiment.

Referring to FIGS. 1 and 2, an embodiment of a test system according to this disclosure includes a first die 1 that is to be tested, a second die 2, and a test device 3. In this embodiment, the first die 1 and the second die 2 are electrically connected to each other and formed on a semiconductor wafer 10, which is placed on a test chuck (not shown).

Figure 3:
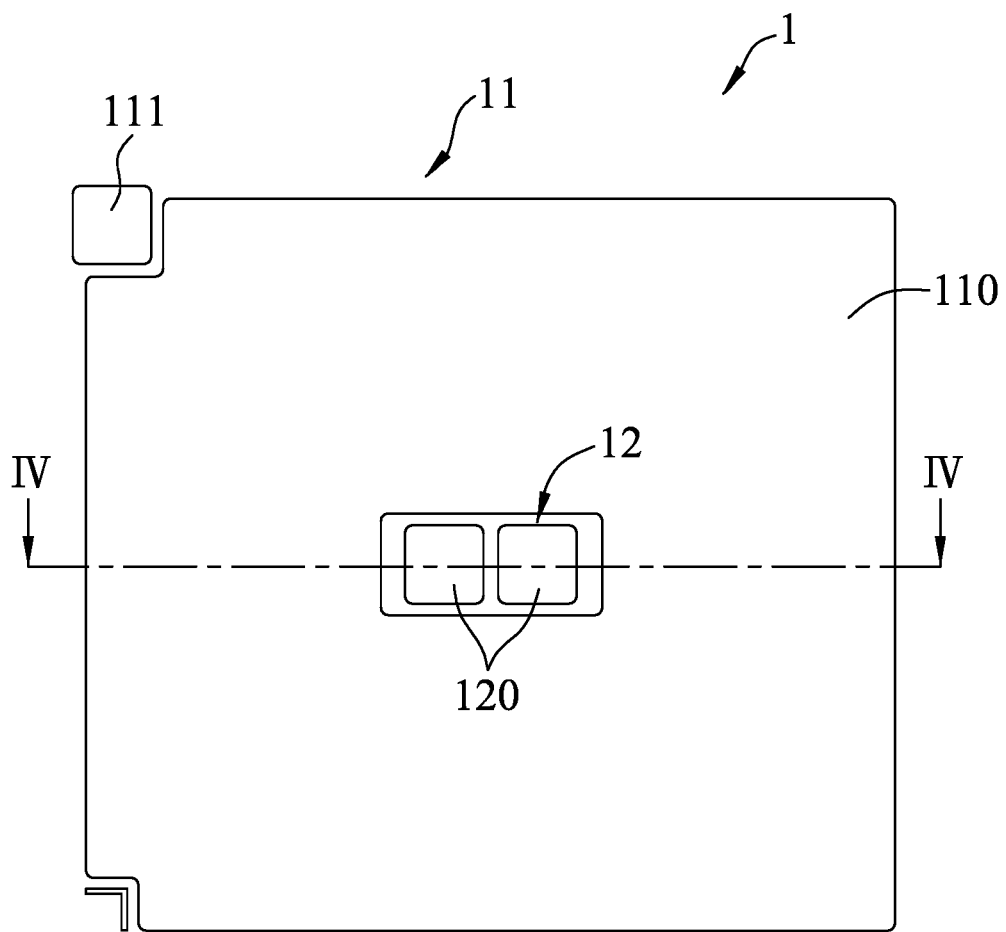
FIG. 3 is a top view illustrating a positional relationship between a to-be-tested transistor and a sense transistor of the to-be-tested die of the embodiment.
Figure 4:
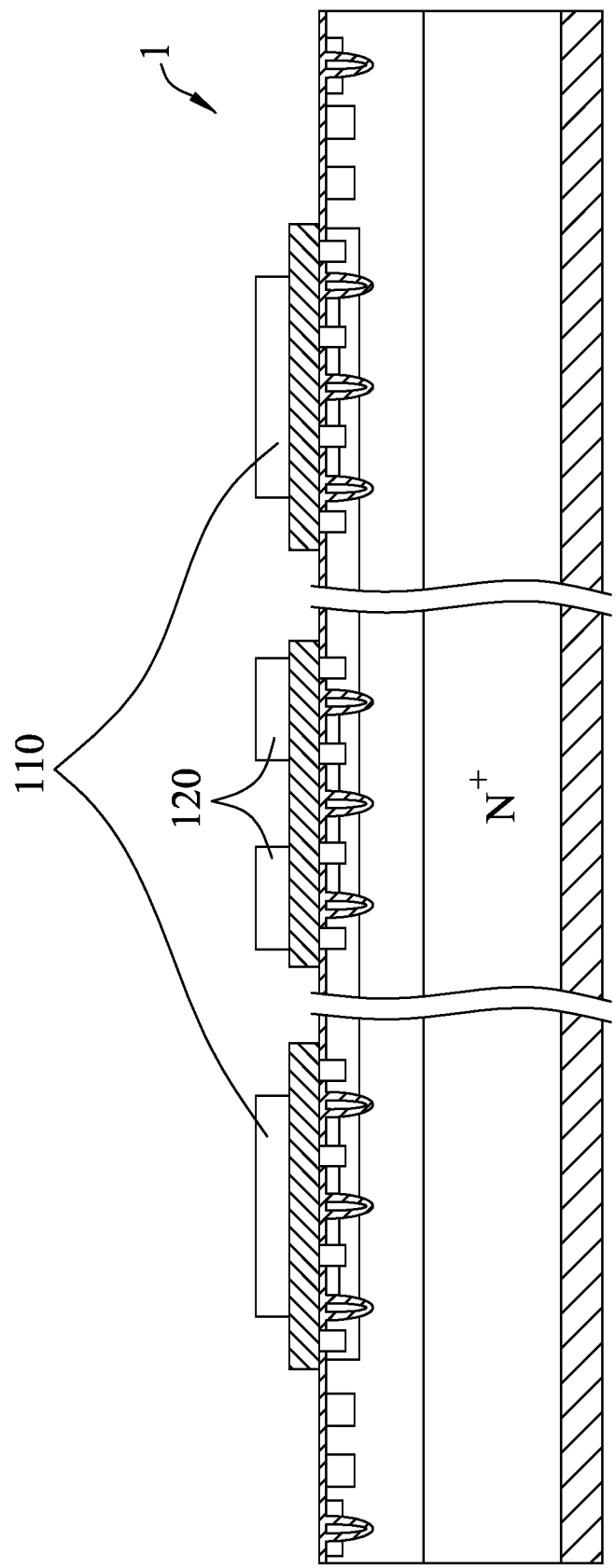
FIG. 4 is a sectional view of the to-be-tested die taken along line IV-IV in FIG. 3.

The first die 1 includes a to-be-tested transistor 11, a sense transistor 12, and four resistors 13, 14, 15, 16. The to-be-tested transistor 11 may be, for example, a power transistor that is used in an input stage of the first die 1. Each of the to-be-tested transistor 11 and the sense transistor 12 includes a first terminal disposed to receive a first test signal, a second terminal, and a control terminal disposed to receive a control signal. The second terminal of the to-be-tested transistor 11 is disposed to receive a second test signal. The first terminal and the control terminal of the to-be-tested transistor 11 are electrically connected to the first terminal and the control terminal of the sense transistor 12, respectively. The resistors 13, 14, 15, 16 represent wire resistances. In this embodiment, each of the to-be-tested transistor 11 and the sense transistor 12 is an N-type metal-oxide-semiconductor field-effect transistor (MOSFET) that has a drain terminal, a source terminal and a gate terminal that respectively serve as the first terminal, the second terminal and the control terminal of the transistor 11, 12, but this disclosure is no limited in this respect. Further referring to FIG. 3, the sense transistor 12 is located at a center of the to-be-tested transistor 11, and is spaced apart from the to-be-tested transistor 11. In the illustrative embodiment, the to-be-tested transistor 11 is shaped as a square ring or a rectangular ring, and a center of the sense transistor 12 is located at the center of the to-be-tested transistor 11. Such configuration may be advantageous in having good thermal stability during chip probing. FIG. 3 illustrates a first contact pad 110 that is electrically connected to the second terminal (i.e., the source terminal in this embodiment) of the to-be-tested transistor 11, a second contact pad 111 that is electrically connected to the control terminal (i.e., the gate terminal in this embodiment) of the to-be-tested transistor 11 (also electrically connected to the control terminal of the sense transistor 12 in this embodiment), and two third contact pads 120 that are both electrically connected to the second terminal (i.e., the source terminal in this embodiment) of the sense transistor 12. FIG. 4 illustrates a sectional view taken along line IV-IV in FIG. 3, where "N$^+$" represents an N-doped semiconductor substrate of the first die 1. The first terminals of the to-be-tested transistor 11 and the sense transistor 12 may be formed as a part of the semiconductor substrate, and thus may be disposed under the contact pads 110, 120 (as well as the contact pads 111 that are not shown in FIG. 4) and not exposed from a top surface of the first die 1 from the perspective of FIG. 4.

The second die 2 is electrically connected between the test device 3 and the first terminal of the to-be-tested transistor 11. In this embodiment, the first die 1 and the second die 2 have the same circuit structure, namely, the second die 2 includes a first transistor 21 and a second transistor (not shown), which are made the same as the to-be-tested transistor 11 and the sense transistor 12 of the first die 1, respectively. Specifically, the first terminal of the first transistor 21 of the second die 2 is electrically connected to the first terminal of the to-be-tested transistor 11 of the first die 1, the second terminal of the first transistor 21 of the second die 2 is electrically connected to the test device 3, and the control terminal of the first transistor 21 of the second die 2 is electrically connected to the test device 3 for the test device 3 to control operation of the first transistor 21 of the second die 2. In some embodiments, the first terminal of the first transistor 21 of the second die 2 and the first terminal of the to-be-tested transistor 11 of the first die 1 are made common terminals (e.g., both being a part of the N$^+$ semiconductor substrate). However, the second die 2 of this disclosure is not limited to the abovementioned configuration.

The test device 3 includes a probe card 31, a signal amplifying unit 32, and a testing unit 33. The signal amplifying unit 32 includes a first input terminal 321, a second input terminal 322 and a third input terminal 323, which may be realized as contact pads.

The probe card 31 is electrically connected to the second terminal and the control terminal of the first transistor 21 of the second die 2, and includes first to eighth probes 311-318.

The first probe 311 is electrically connected between the second terminal of the to-be-tested transistor 11 and the testing unit 33. The second probe 312 is electrically connected between the second terminal of the to-be-tested transistor 11 and the first input terminal 321 of the signal amplifying unit 32 (namely, the first input terminal 321 of the signal amplifying unit 32 is electrically connected to the second terminal of the to-be-tested transistor 11 through the probe card 31). The third probe 313 is electrically connected between the second terminal of the sense transistor 12 and the second input terminal 322 of the signal amplifying unit 32 (namely, the second input terminal 322 of the signal amplifying unit 32 is electrically connected to the second terminal of the sense transistor 12 through the probe card 31). The fourth probe 314 is electrically connected between the second terminal of the sense transistor 12 and the third input terminal 323 of the signal amplifying unit 32 (namely, the third input terminal 323 of the signal amplifying unit 32 is electrically connected to the second terminal of the sense transistor 12 through the probe card 31). The fifth probe 315 is electrically connected between the control terminal of the to-be-tested transistor 311 and the testing unit 33. The sixth probe 316, the seventh probe 317 and the eighth probe 318 are electrically connected between the second die 2 and the testing unit 33. In this embodiment, the first probe 311 and the second probe 312 are connected to the second terminal of the to-be-tested transistor 11 in a Kelvin connection (namely, one probe is connected to a force line and the other probe is connected to a sense line); the third probe 313 and the fourth probe 314 are connected to the second terminal of the sense transistor 12 in a Kelvin connection; the sixth probe 316 and the seventh probe 317 are connected to the second terminal of the first transistor 21 of the second die 2 in a Kelvin connection; and the eighth probe 318 is connected to the control terminal (having a contact pad on a top surface of the second die 2, similar to the second contact pad 111 in FIG. 3) of the first transistor 21 of the second die 2 for the testing unit 33 to control operation of the first transistor 21 of the second die 2.

The first probe 311 is electrically connected to the testing unit 33 through a force line 311F. The second probe 312 is electrically connected to the signal amplifying unit 32 through a sense line 312S. The third probe 313 and the fourth probe 314 are electrically connected to the signal amplifying unit 32 through a sense line 313S and a force line 314F, respectively. The fifth probe 315 is electrically connected to the testing unit 33 through a connection line 315L. The sixth probe 316 and the seventh probe 317 are electrically connected to the testing unit 33 through a force line 316F and a sense line 317S, respectively. The eighth probe 318 is electrically connected to the testing unit 33 through a connection line 318L. In FIG. 2, a resistor R311 is used to denote an equivalent wire resistance of the first probe 311 and the force line 311F; a resistor R312 is used to denote an equivalent wire resistance of the second probe 312 and the sense line 312S; a resistor R313 is used to denote an equivalent wire resistance of the third probe 313 and the sense line 313S; a resistor R314 is used to denote an equivalent wire resistance of the fourth probe 314 and the force line 314F; a resistor R315 is used to denote an equivalent wire resistance of the fifth probe 315 and the connection line 315L; a resistor R316 is used to denote an equivalent wire resistance of the sixth probe 316 and the force line 316F; a resistor R317 is used to denote an equivalent wire resistance of the seventh probe 317 and the sense line 317S; and a resistor R318 is used to denote an equivalent wire resistance of the eighth probe 318 and the connection line 318L.

The signal amplifying unit 32 is configured to stabilize voltages at the second input terminal 322 and the third input terminal 323 based on a voltage at the first input terminal 321, and to generate an amplification voltage based on the voltages at the first input terminal 321, the second input terminal 322 and the third input terminal 323. In this embodiment, the signal amplifying unit 32 includes an operational amplifier 324, a capacitor 325, a transistor 326, and a resistor 327 that has a predetermined resistance.

The operational amplifier 324 has a first input that is electrically connected to the first input terminal 321, a second input that is electrically connected to the second input terminal 322, and an output. The operational amplifier 324 is configured to generate an amplifier output signal at the output thereof based on signals at the first input and the second input. In the illustrative embodiment, the first input and the second input of the operational amplifier 324 are a non-inverting input and an inverting input, respectively. The capacitor 325 is electrically connected between the output of the operational amplifier 324 and ground. The transistor 326 has a first terminal electrically connected to the third input terminal 323, a second terminal, and a control terminal electrically connected to the output of the operational amplifier 324 for receiving the amplifier output signal. The transistor 326 is operable by the amplifier output signal to make or break electrical connection between the first terminal and the second terminal thereof. The resistor 327 has a first terminal electrically connected to the testing unit 33 and the second terminal of the transistor 326, and a second terminal connected to ground. A voltage across the resistor 327 servers as the amplification voltage. In this embodiment, the transistor 326 is a P-type MOSFET that has a source terminal, a drain terminal and a gate terminal that serve as the first terminal, the second terminal and the control terminal of the transistor 326, but this disclosure is not limited in this respect.

The testing unit 33 is electrically connected to the first terminal of the resistor 327 for receiving the amplification voltage therefrom, and is electrically connected to the first probe 311, the fifth probe 315, the sixth probe 316, the seventh probe 317 and the eighth probe 318 through the force line 311F, the connection line 315L, the force line 316F, the sense line 317S and the connection line 318L, respectively. The testing unit 33 may include a power supply (not shown) and/or a signal generator (not shown) to generate the first test signal, the second test signal, the control signal and a signal for controlling operation of the first transistor 21 of the second die 2. The testing unit 33 controls, through the connection line 318L and the eighth probe 318, the first transistor 21 of the second die 2 to conduct, and provides the first test signal to the second terminal of the first transistor 21 of the second die 2 (which has a contact pad at the top surface of the second die 2, similar to the first contact pad 110 in FIG. 3), so that the first transistor 21 of the second die 2 outputs the first test signal to the first terminals of the to-be-tested transistor 11 and the sense transistor 12 through the first terminal of the first transistor 21 of the second die 2. Since the first test signal is provided through the contact pad of the second terminal of the first transistor 21 of the second die 2, which is exposed from the top surface of the semiconductor wafer, there is no need for performing the BGBM process on the semiconductor wafer before the chip probing, and the aforesaid first problem (namely, wafer warpage due to the BGBM process, which may adversely affect connection between drain terminals of the to-be-tested transistor 11 and the sense transistor 12 and the test chuck that provides test signals) can be avoided. The testing unit 33 transmits the second test signal to the second terminal of the to-be-tested transistor 11 through the force line 311F and the first probe 311, and transmits the control signal to the control terminal of the to-be-tested transistor 11 through the connection line 315L and the fifth probe 315. The testing unit 33 uses the first test signal and the second test signal to determine a first current magnitude of a current flowing through the first terminal and the second terminal of the to-be-tested transistor 11, and acquires a second current magnitude of a current flowing through the first terminal and the second terminal of the sense transistor 12 based on the amplification voltage and the predetermined resistance of the resistor 327 (e.g., the testing unit 33 may include a voltage meter (not shown) to measure the amplification voltage, and a processor (not shown) to compute the second current magnitude). Then, the testing unit 33 acquires a current ratio based on the first current magnitude and the second current magnitude, and determines whether the first die 1 is defective based on the current ratio. In this embodiment, the current ratio is a ratio of the first current magnitude to the second current magnitude, but this disclosure is not limited in this respect. The testing unit 33 determines whether the current ratio conforms to a predetermined current ratio. When the current ratio thus acquired does not conform to the predetermined current ratio, the testing unit 33 may determine that the first die 1 is defective, but this disclosure is not limited in this respect. In this embodiment, the current ratio is obtained directly from the first current magnitude and the second current magnitude, without the need of measuring the on-resistances of the to-be-tested transistor 11 and the sense transistor 12, so the aforesaid second problem (namely, variations in the contact resistance between the probes and the contact pads, which may affect the obtained on-resistances of the to-be-tested transistor 11 and the sense transistor 12) can be avoided.

To sum up, the embodiment of the test system according to this disclosure uses the testing unit 33 to provide the first test signal to the first terminal of the to-be-tested transistor 11 and the sense transistor 12 through the probe card 31 and the second die 2, thereby avoiding the aforesaid first problem where the to-be-tested wafer is unable to fit the test chuck well, which may result in measurement errors. Furthermore, the embodiment uses the signal amplifying unit 32 to perform voltage stabilization and generate the amplification voltage, so as to precisely determine the current flowing through the sense transistor 12, and obtain a more accurate current ratio. In addition, by placing the sense transistor 12 at the center of the to-be-tested transistor 11, the sense transistor 12 would have the same heat level as the to-be-tested transistor during operation, thereby promoting thermal stability of the first die 1 during the chip probing.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A test system, comprising:
   a to-be-tested die that includes a to-be-tested transistor and a sense transistor, each of which includes a first terminal disposed to receive a first test signal, a second terminal, and a control terminal disposed to receive a control signal, wherein said second terminal of said to-be-tested transistor is disposed to receive a second test signal; and
   a test device that includes:
   a probe card electrically connected to said to-be-tested die;
   a signal amplifying unit including a first input terminal, a second input terminal and a third input terminal that are electrically connected to said probe card, wherein said first input terminal is electrically connected to said second terminal of said to-be-tested transistor through said probe card, wherein said second input terminal and said third input terminal are electrically connected to said second terminal of said sense transistor through said probe card, and wherein said signal amplifying unit is configured to stabilize voltages at said second input terminal and said third input terminal based on a voltage at said first input terminal, and to generate an amplification voltage based on the voltages at said first input terminal, said second input terminal and said third input terminal; and
   a testing unit electrically connected to said signal amplifying unit for receiving the amplification voltage therefrom, electrically connected to said probe card, and configured to generate and output the first test signal to said first terminal of said to-be-tested transistor through said probe card, to generate and output the second test signal to said second terminal of said to-be-tested transistor through said probe card, and to generate and output the control signal to said control terminal of said to-be-tested transistor through said probe card;
   wherein said testing unit is further configured to determine a first current magnitude of a current flowing through said to-be-tested transistor based on the first test signal and the second test signal, to acquire a second current magnitude of a current flowing through said sense transistor based on the amplification voltage and a predetermined resistance, and to acquire, based on the first current magnitude and the second current magnitude, a current ratio that is used to determine whether said to-be-tested die is defective.

2. The test system as claimed in claim 1, further comprising:
another die that is electrically connected between said probe card and said first terminal of said to-be-tested transistor of said to-be-tested die,
wherein said testing unit is configured to output the first test signal to said first terminal of said to-be-tested transistor through said probe card and said another die.

3. The test system as claimed in claim 1, wherein said signal amplifying unit further includes:
an operational amplifier having a first input that is electrically connected to said first input terminal of said signal amplifying unit, a second input that is electrically connected to said second input terminal of said signal amplifying unit, and an output, said operational amplifier being configured to generate an amplifier output signal at said output based on signals at said first input and said second input;
a capacitor to electrically connect said output of said operational amplifier to ground;
a transistor having a first terminal electrically connected to said third input terminal of said signal amplifying unit, a second terminal, and a control terminal electrically connected to said output of said operational amplifier; and
a resistor having a first terminal electrically connected to said testing unit and said second terminal of said transistor, and a second terminal to be connected to ground; and
wherein a voltage across said resistor serves as the amplification voltage, and a resistance of said resistor serves as the predetermined resistance.

4. The test system as claimed in claim 1, wherein said probe card includes:
a first probe that is electrically connected between said second terminal of said to-be-tested transistor and said testing unit, and that is disposed to transmit the second test signal from said testing unit to said second terminal of said to-be-tested transistor;
a second probe that is electrically connected between said second terminal of said to-be-tested transistor and said first input terminal of said signal amplifying unit;
a third probe that is electrically connected between said second terminal of said sense transistor and said second input terminal of said signal amplifying unit;
a fourth probe that is electrically connected between said second terminal of said sense transistor and said third input terminal of said signal amplifying unit; and
a fifth probe that is electrically connected between said control terminal of said to-be-tested transistor and said testing unit, and that is disposed to transmit the control signal from said testing unit to said control terminal of said to-be-tested transistor.

5. The test system as claimed in claim 4, wherein said first probe and said second probe are connected to said second terminal of said to-be-tested transistor in a Kelvin connection, and said third probe and said fourth probe are connected to said second terminal of said sense transistor in a Kelvin connection.

6. The test system as claimed in claim 1, wherein said sense transistor is located at a center of said to-be-tested transistor.

7. The test system as claimed in claim 1, wherein said first terminal and said control terminal of said to-be-tested transistor are electrically connected to said first terminal and said control terminal of said sense transistor, respectively.

8. A test device adapted for testing a to-be-tested die on a wafer, the to-be-tested die including a to-be-tested transistor and a sense transistor, each of which includes a first terminal, a second terminal and a control terminal, the first terminal and the control terminal of the to-be-tested transistor being electrically connected to the first terminal and the control terminal of the sense transistor, respectively, said test device comprising;
a probe card to be electrically connected to the to-be-tested die;
a signal amplifying unit including a first input terminal, a second input terminal and a third input terminal that are electrically connected to said probe card, wherein said first input terminal is to be electrically connected to the second terminal of the to-be-tested transistor through said probe card, wherein said second input terminal and said third input terminal are to be electrically connected to said second terminal of said sense transistor through said probe card, and wherein said signal amplifying unit is configured to stabilize voltages at said second input terminal and said third input terminal based on a voltage at said first input terminal, and to generate an amplification voltage based on the voltages at said first input terminal, said second input terminal and said third input terminal; and
a testing unit electrically connected to said signal amplifying unit for receiving the amplification voltage therefrom, electrically connected to said probe card, and configured to generate and output a first test signal, a second test signal and a control signal to said probe card, so as to provide the first test signal, the second test signal and the control signal respectively to the first terminal, the second terminal and the control terminal of the to-be-tested transistor through said probe card;
wherein said testing unit is further configured to determine a first current magnitude of a current flowing through the to-be-tested transistor based on the first test signal and the second test signal, to acquire a second current magnitude of a current flowing through the sense transistor based on the amplification voltage and a predetermined resistance, and to acquire, based on the first current magnitude and the second current magnitude, a current ratio that is used to determine whether the to-be-tested die is defective.

9. The test device as claimed in claim 8, wherein said signal amplifying unit further includes:
an operational amplifier having a first input that is electrically connected to said first input terminal of said signal amplifying unit, a second input that is electrically connected to said second input terminal of said signal amplifying unit, and an output, said operation amplifier being configured to generate an amplifier output signal at said output based on signals at said first input and said second input;
a capacitor to electrically connect said output of said operational amplifier to ground;
a transistor having a first terminal electrically connected to said third input terminal of said signal amplifying unit, a second terminal, and a control terminal electrically connected to said output of said operational amplifier; and
a resistor having a first terminal electrically connected to said testing unit and said second terminal of said transistor, and a second terminal to be connected to ground; and wherein a voltage across said resistor serves as the amplification voltage, and a resistance of said resistor serves as the predetermined resistance.

10. The test device as claimed in claim 8, wherein said probe card includes:
a first probe to electrically connect the second terminal of the to-be-tested transistor to said testing unit, and disposed to transmit the second test signal from said testing unit to the second terminal of the to-be-tested transistor;
a second probe to electrically connect the second terminal of the to-be-tested transistor to said first input terminal of said signal amplifying unit;
a third probe to electrically connect the second terminal of the sense transistor to said second input terminal of said signal amplifying unit;
a fourth probe to electrically connect the second terminal of the sense transistor to said third input terminal of said signal amplifying unit; and
a fifth probe to electrically connect the control terminal of the to-be-tested transistor to said testing unit, and disposed to transmit the control signal from said testing unit to the control terminal of the to-be-tested transistor.

11. The test device as claimed in claim 10, wherein said first probe and said second probe are configured to be connected to the second terminal of the to-be-tested transistor in a Kelvin connection, and said third probe and said fourth probe are configured to be connected to the second terminal of the sense transistor in a Kelvin connection.

* * * * *